(12) United States Patent
Anderson et al.

(10) Patent No.: US 6,284,443 B1
(45) Date of Patent: Sep. 4, 2001

(54) METHOD AND APPARATUS FOR IMAGE ADJUSTMENT

(75) Inventors: Brent A. Anderson, Jericho; Michael S. Hibbs, Westford, both of VT (US); Subramian S. Iyer, Mt. Kisro, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/302,628

(22) Filed: Apr. 30, 1999

(51) Int. Cl.[7] .................................................. G03C 7/00
(52) U.S. Cl. ............................ 430/363; 438/949; 355/53
(58) Field of Search ............................ 257/798; 438/947, 438/949; 430/363, 945, 944; 355/54, 53, 68

(56) References Cited

U.S. PATENT DOCUMENTS

| | | |
|---|---|---|
| 4,869,999 | 9/1989 | Fukuda et al. |
| 4,935,334 | 6/1990 | Boettiger et al. |
| 4,992,825 | 2/1991 | Fukuda et al. |
| 5,087,537 | 2/1992 | Conway et al. |
| 5,097,291 * | 3/1992 | Suzuki .................................. 355/69 |
| 5,114,876 | 5/1992 | Weiner. |
| 5,191,374 * | 3/1993 | Hazama et al. ........................ 355/43 |
| 5,194,893 | 3/1993 | Nishi. |
| 5,213,916 | 5/1993 | Cronin et al. |
| 5,316,969 | 5/1994 | Ishida et al. |
| 5,334,467 | 8/1994 | Cronin et al. |

(List continued on next page.)

FOREIGN PATENT DOCUMENTS

| | | |
|---|---|---|
| 831376 | 3/1998 | (EP). |
| 8222495 | 8/1996 | (JP). |

OTHER PUBLICATIONS

Abolafia, O. R. et al., "Dual Density Masks for Photoresists", IBM Technical Disclosure Bulletin, vol. 8, No. 77, Aug. 1977, pp. 964–965.

Cote, W. J. et al., "Photo Process For Defining Two Mask Levels In One Step", IBM Technical Disclosure Bulletin, vol. 31, No. 5, Oct. 1998, pp. 299–300.

Cronin, J.E., "Process For Formation Of Conductors At Variable Depths", Research Disclosure, Jul. 1988, No. 291.

Cronin, J. E. et al., "Concurrent Double Level Wiring Process", IBM Technical Disclosure Bulletin, vol. 32, No. 3A, Aug. 1989, pp. 433–435.

Grobman, W. D., "E–beam Proximity Effect Dose Correction Using Computer Time Proportional To The Number Of Shapes To Be Corrected", IBM Technical Disclosure Bulletin, vol. 24, No. 12, May 1982, pp. 6315–6317.

(List continued on next page.)

Primary Examiner—Olik Chaudhuri
Assistant Examiner—Ginette Peralta
(74) Attorney, Agent, or Firm—Connolly Bove Lodge & Hutz, LLP; James M. Leas, Esq.

(57) ABSTRACT

A method of variably exposing photosensitive material. A semiconductor wafer is provided. A first target region and a second target region are identified on the semiconductor wafer. Photosensitive material is provided on the semiconductor wafer. An illuminating system including a source of illumination is provided. A mask is provided between the source of illumination and the photosensitive material. The photosensitive material is illuminated through the mask with the illuminating system to provide in a single step of the illuminating system a first illumination dose to the first target region and a second illumination dose to the second target region. The first illumination dose differs from the second illumination dose. No further illumination dose is provided to equalize the first illumination dose and the second illumination dose.

24 Claims, 4 Drawing Sheets

U.S. PATENT DOCUMENTS

| | | |
|---|---|---|
| 5,437,946 | 8/1995 | McCoy . |
| 5,585,211 | 12/1996 | Firstein et al. . |
| 5,591,958 | 1/1997 | Nishi et al. . |
| 5,614,990 | 3/1997 | Bruce et al. . |
| 5,627,625 * | 5/1997 | Ogawa .................................... 355/53 |
| 5,627,627 | 5/1997 | Suzuki . |
| 5,663,017 | 9/1997 | Schinella et al. . |
| 5,728,495 | 3/1998 | Ozawa . |
| 5,742,376 | 4/1998 | Makinouchi . |

OTHER PUBLICATIONS

Hafner, B. et al., "Planarizing Metal Insulator Structures", *IBM Technical Disclosure Bulletin*, vol. 32, No. 5A, Oct. 1989, pp. 408–409.

Hafner, B. et al., "Planarizing Metal Insulator Structures", *IBM Technical Disclosure Bulletin*, vol. 32, No. 5A, Oct. 1989, pp. 342–347.

Magyar, R. J. et al., "Expose Machine Shutter Control Unit", *IBM Technical Disclosure Bulletin*, vol. 32, No. 5A, Oct. 1989, pp. 342–347.

* cited by examiner

METHOD AND APPARATUS FOR IMAGE ADJUSTMENT

FIELD OF THE INVENTION

The invention relates to semiconductor device manufacture. In particular, the present invention relates to methods for exposing photosensitive material.

BACKGROUND OF THE INVENTION

As time goes on, semiconductor devices continue to shrink in size and grow in density and complexity. This has driven a migration towards a "System on a Chip" where different devices are built in to a single computer chip. For example, logic structure and memory structures may be included in one chip. Along these lines, one chip could include logic, DRAM, SRAM, NVRAM and/or SiGe features.

As the complexity in manufacturing these semiconductor chips increases, there is often a need to optimize conflicting needs from different devices. For example, while logic portions of a chip may require changing channel length to tradeoff speed against yield, this variability in channel length may have a negative impact on the storage parts of chips.

Also, many semiconductor devices are very sensitive to feature size differences across a chip or wafer. As feature sizes continue to decrease and the number of features on a single chip increases, line width uniformity specifications become tighter with each generation. A variety of methods may be employed to improve uniformity and decrease line width variation.

SUMMARY OF THE INVENTION

The present invention provides a method for variably exposing photosensitive material. According to the method, a semiconductor wafer is provided. A first target region and a second target region are identified on a semiconductor wafer. Photosensitive material is provided on the semiconductor wafer. An illuminating system comprising a source of illumination is provided. A mask is provided between the source of illumination and the photosensitive material. The photosensitive material is illuminated through the mask with the illuminating system to provide in a single step of a illuminating system a first illumination goes to the first target region and a second illumination goes to the second target region. The first illumination dose differs from the second illumination dose, wherein no further dose is provided to equalize the first illumination dose and the second illuminating dose.

The present invention also includes a method for variably exposing photosensitive material. The method includes identifying at least two target regions on the photosensitive material. The photosensitive material is illuminated in one step with at least two illumination doses to the at least two target regions. At least some of the illumination doses differ from each other, wherein no further illumination doses are provided to equalize the illumination doses.

The present invention also includes a semiconductor device formed according to a process that includes applying a photosensitive material to a semiconductor substrate, identifying at least two target regions on the photosensitive material, and illuminating the photosensitive material in one step with at least two illumination doses to the at least two target regions. At least some of the illumination doses differ from each other, wherein no further illuminating is provided to equalize the illumination doses.

Still other objects and advantages of the present invention will become readily apparent by those skilled in the art from the following detailed description, wherein it is shown and described only the preferred embodiments of the invention, simply by way of illustration of the best mode contemplated of carrying out the invention. As will be realized, the invention is capable of other and different embodiments, and its several details are capable of modifications in various obvious respects, without departing from the invention. Accordingly, the drawings and description are to be regarded as illustrative in nature and not as restrictive.

BRIEF DESCRIPTION OF THE DRAWINGS

The above-mentioned objects and advantages of the present invention will be more clearly understood when considered in conjunction with the accompanying drawings, in which:

FIG. 3b represents an embodiment of a filter that may be utilized to expose the photosensitive material in the process of creating the features illustrated in FIG. 3a;

DETAILED DESCRIPTION OF THE INVENTION

Figure 1:
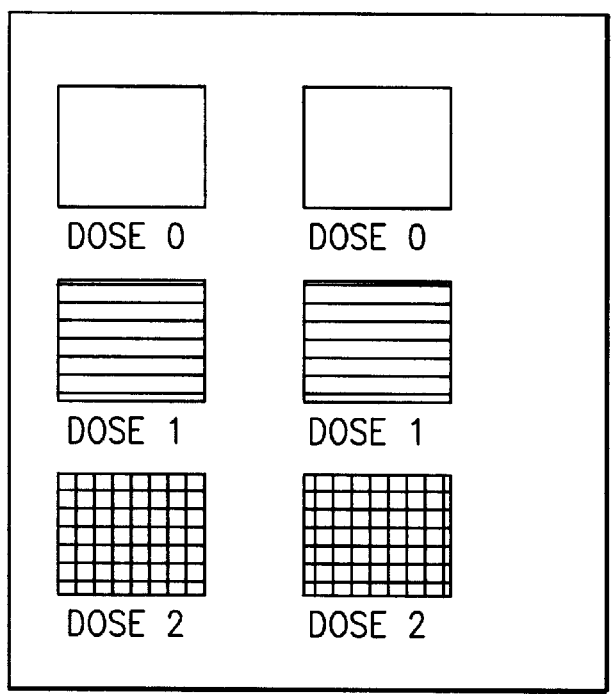
FIG. 1 represents an overhead view of an embodiment of a filter that may be utilized according to the present invention to produce differential exposure of photosensitive material.

The present invention provides methods for differentially exposing photosensitive material. The differential exposure may be produced according to a number of different methods. Significantly, by varying the exposure dose across photosensitive material, the present invention may exercise much greater control over exposure of the photosensitive material and may be utilized in the creation of different types of features on a single chip. Further significantly, the present invention may differentially expose regions of a photosensitive material in a single exposure.

According to some embodiments, the present invention utilizes regionalized mask filtering to create sub-field optimization to control separate parts of a chip or reticle field. Utilizing the present invention, adjustments can be made to line width and in different parts of each chip or reticle field without the need to recreate a mask. A subfield optimization is utilized to isolate characterize and/or control separate parts of a chip.

According to another embodiment, the present invention utilizes an additional dose control mask to correct for feature size errors on a mask. Variable levels of filtering may be employed across the mask to adjust the amount of transmitted light. Thus, the present invention can adjust size of printed features.

The present invention includes a method for varying exposure of photosensitive material. According to the method, at least two target regions, such as a first target region and a second target region may be identified on a provided semiconductor wafer. Prior to or after identifying target regions, photosensitive material may be provided on a surface of the semiconductor wafer.

An illumination system may be provided according to the present invention. The illumination system may include a source of illumination. Any illumination system typically used in semiconductor photolithographic applications may be utilized here. A mask is provided between the source of illumination and the photosensitive material.

The illuminating system may be a scanning illuminating system. Alternatively, the illuminating system could be a stepper. According to other embodiments, the illuminating system utilized may be optical or x-ray.

Photosensitive material may be illuminated according to the present invention through a mask with an illuminating system to provide illumination doses to photosensitive material. Typically, the illumination doses are provided in a single step of the illuminating system. Additionally, the doses of each target area typically are different. If there are only two target regions then the doses of the different target regions will be different. However, if there are more than two target regions, in some instances, some target regions may have the same dose, while at least two different doses are provided. According to the present invention, no further doses are provided to equalize the doses of the different target regions.

The illuminating dosage may be varied between or among target regions in a variety of different manners. Typically, at least one parameter of the illuminating system may be varied to vary the illuminating dosage of the target regions. If the illuminating is carried out in a single step, the parameter typically is varied during this single step. Among the parameters of the illuminating system that may be varied are intensity of the source of illumination, brightness of the source of illumination, pulse frequency of the source of illumination, pulse width of the source of illumination, focus of the source of illumination, scan speed of the source of illumination, relative speed of the mask and the substrate, as well as the electromagnetic radiation produced by the source of illumination, through the use of one or more filters or filtering elements, among other parameters. In some instances, the filters or regions of the filters may alter the illumination while still permitting the illumination to pass through the filter. In other cases, the filtering elements may entirely block the illumination.

In the event that the intensity of the source of illumination is the parameter that is varied, the intensity may be varied by varying the brightness of the source of illumination. The intensity may also be varied by varying the pulse frequency or width or by varying the focus of the source of illumination.

The intensity may also be varied by varying the frequency of illumination pulses in embodiments where the illumination is carried out with a source of illumination that provides pulses of illumination having a pulse frequency.

The dosage of illumination received by the photosensitive material may also be varied by introducing elements between the source of illumination and the photosensitive material. The elements introduced between the source of illumination and photosensitive material may include one or more filters. The elements may also include elements added to the mask to partially and/or fully block at least a portion of the illumination.

In the event that present invention includes use of elements on the mask to block or alter the illumination, the present invention may include adding a plurality of non-transparent features to the mask. Typically, at least one non-transparent feature may be included on the mask. According to some embodiments, a plurality of non-transparent features may be included on the mask.

Typically, the non-transparent features result in localized light filtering or blocking during the photolithographic process. According to one embodiment, a plurality of chrome dots of any shape may be arranged on localized areas of the reticle. The chrome dot or dots may be randomly arranged. Chrome dots in such applications may act similarly to a neutral density filter in photographic applications to more or less uniformly reduce the exposure without changing the optical properties.

When utilizing chrome dots, if a desired dose reduction is about 10%, then a local density of chrome to non-chrome areas on a mask would be about 10%. Feature size of the chrome dots is typically maintained small to prevent or minimize interference with the pattern mask features. A filter mask including chrome dots may be positioned to be slightly out of focus to prevent similar interference.

As stated above, the present invention may also include arranging at least one filter between the source of illumination and the photosensitive material. At least one filter may be arranged between the source of illumination and the photosensitive material. According to some embodiments, a plurality of filters are arranged between the source of illumination and the photosensitive material.

One or more of the filter or filters may include at least one filtering feature for resulting in differential levels of filtering of the illumination, and, thereby, differential exposure of the photosensitive material. Each feature on the filter or filters may uniformly filter the source of illumination. Alternatively, in the differential levels of filtering within a single feature of each filter or filters. Therefore, one or more of the filter or filters and/or one or more features of one or more filter or filters may uniformly filter the source of illumination. Alternatively, one or more of the filter or filters and/or one or more features of one or more filter or filters may gradationally filter the source of illumination.

The filters may introduce localized dose offsets in the printed image. The localized dose offsets can change the resulting resist line widths. As noted above, line width uniformity variation across a reticle field may be a particularly troublesome problem as feature sizes decrease and feature density increases.

A filter according to the present invention could include chrome or opaque dots, a thin film layer, and/or implanted ion. While chrome or opaque dots may be arranged on a mask, a thin film layer may be provided on a separate mask or on the backside of the mask. Ion implant may take place in the glass of a mask or on a separate mask as well. The ion implant may actually damage the glass to change its transmission properties. It is typically desirable to reduce exposure without changing optical properties.

As discussed above, the filtering may result in localized dose offsets. The offsets may change resulting line widths exposed in the photosensitive material. The localized dose offsets may also be produced according to other methods.

Alternative techniques for introducing localized dose offsets other than the present invention may require creating multiple masks and utilizing multiple exposures. Both utilizing multiple masks and multiple exposures can significantly increase the cost of processing operations and introduces other problems such as alignment error.

The filters used according to the present invention may be part of a standard mask or a separate filter mask. The present invention may include multiple levels within a field and/or chip. Single or multiple filter masks may be utilized. The filters may be uniformly integrated. Also, the filters may be utilized in a fixed or programmable array. Furthermore, the filters may be reworkable on the mask.

The present invention may also achieve differential exposure of photosensitive material by altering positions of the photosensitive material and the source of illumination relative to each other. For example, the illumination of the photosensitive material may be carried out with a scanner. The parameter of the illumination system that is varied to alter exposure doses may include the relative angle of the scanner and the photosensitive material, where the underlying semiconductor wafer, the distance between the scanner and the semiconductor wafer, scanning speed, roll, pitch, yaw, and/or relative movement of the scanner and the semiconductor wafer and x, y, and/or z directions, among other parameters.

Any one or more of these parameters may be altered in a variety of ways. The alterations may be carried out by modifying positioning system tracking algorithms to change scan targets.

Another parameter that may be altered is reticle tracking of the wafer surface. According to the present invention, intermediate targets and offsets may be added to positioning algorithms to cause shifts in the position or scan speed of a mask and/or substrate during exposure of a photolithographic pattern. At least one intermediate target region may be identified between a first target region and a second target region. Changing the speed of the various elements of the photolithography system and/or the photosensitive material may include increasing the speed or decreasing the speed. As with any other parameter described herein, the speed(s) may be changed continuously or intermittently.

The intermediate targets may be characterized such that at selected points in the field, controlled modifications of the mask image are projected onto the photosensitive material. The intermediate targets may comprise shifts in velocity and/or intensity, shifts in the x, y, and/or z directions, and/or changes in roll, pitch, and/or yaw.

Regardless of what parameter or parameters that change in the process of exposing photosensitive material, the parameter or parameters may be varied step-wise or continuously or in combination both. Additionally, it is not necessary that if more than one parameter is altered, that the parameters be altered in the same manner. For example, one parameter may be altered stepwise and one parameter may be altered continuously or in combination thereof.

By altering parameters related to scanning exposure of a photosensitive material, a variety of things can be accomplished. For example, across chip line width variation (ACLV) monitoring can be carried out. ACLV may be critical to performance of a chip. Yet it is very difficult to characterize a sensitivity of different areas of logic chips to this parameters. By shifting the velocity of a mask and substrate several times during an exposure, ACLV may be introduced into the chip and sensitivities can be evaluated with normal testing.

Additionally, the present invention may permit gate level optimization to be carried out. Optimization of array devices often creates a narrow process window for gate widths. However, microprocessor applications typically require speed sorts over a wide range. By modifying the exposure velocity at a transition region between two devices, array line widths can remain constant while tailoring a logic device. Also, by adjusting the level of filtering in either the array or microprocessor region, a dose offset can be created that provides for dose optimization of both regions.

Additionally, by utilizing the present invention, graded junctions may be created. Scanning exposure tools are also used in non-resist applications to create shallow doped regions. By shifting relative positions of a substrate during exposure and then quickly shifting it back, a localized graded junction may be created with a profile larger than a mask image. This affect can be more uniform by repeating it at frequencies that are dependant on the scan width.

Another example of an application of the present invention may be utilized with is laser doping. For example, Photo Gas Immersion By Laser Doping (PGILD), for example, see U.S. Pat. No. 5,114,876, the entire contents of the disclosure of which are hereby incorporated by reference, is a promising technology for creating doped regions on a wafer. However, current methods require uniform doses across a chip and reticle field. Utilizing localized filtering allows for optimization or adjusting of doping levels for different areas of a chip or different values across the field.

A further application the present invention may be utilized with is speed sort distribution. Microprocessor speed requirements often require that deep speed sorting be done. Speed sorting may drive gate widths to a narrow end of the process window. Small changes in dose from the desired target can create parts that are either too slow or have low yields due to short channel effects. By utilizing a filter with different levels of filtering for different chips within a reticle field, a distribution of channel lengths can be created.

An alternative to utilizing methods according to the present invention for speed sort distribution could include changing doses between reticle fields. However, this may significantly slow down the photolithographic operation.

Figure 2:
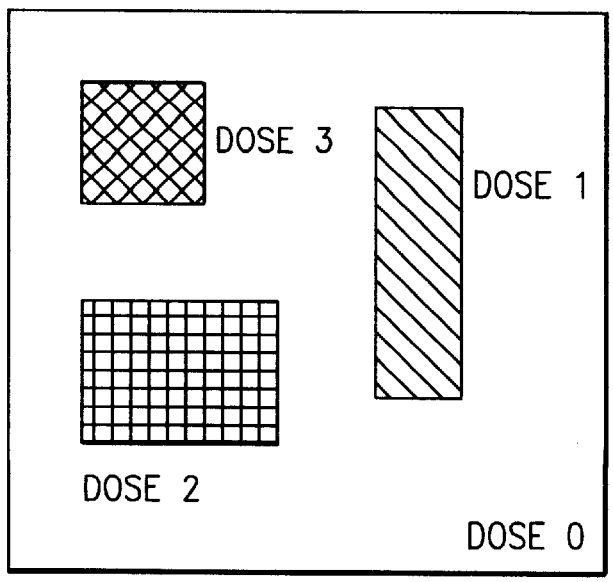
FIG. 2 represents an overhead view of a surface of a layer of photosensitive material wherein different doses of illumination have been provided to various regions of the chip.

FIG. 1 illustrates an example of a filter including different levels of filtering for chips within a reticle field. FIG. 2 illustrates different levels of filtering within a chip, indicating the different dosage levels that the various portions of the photosensitive material are receiving.

Figure 3A:
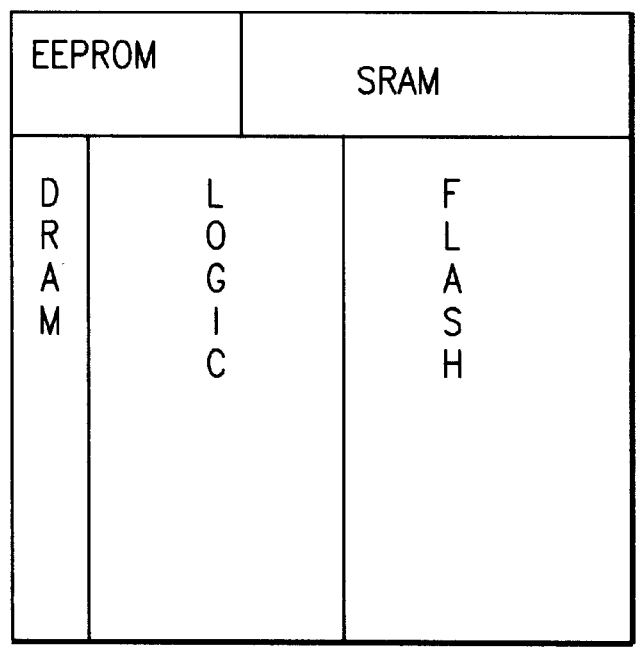
FIG. 3a represents a schematic view of an embodiment of a chip identifying the various types of features to be provided on different regions of the chip.
Figure 3B:
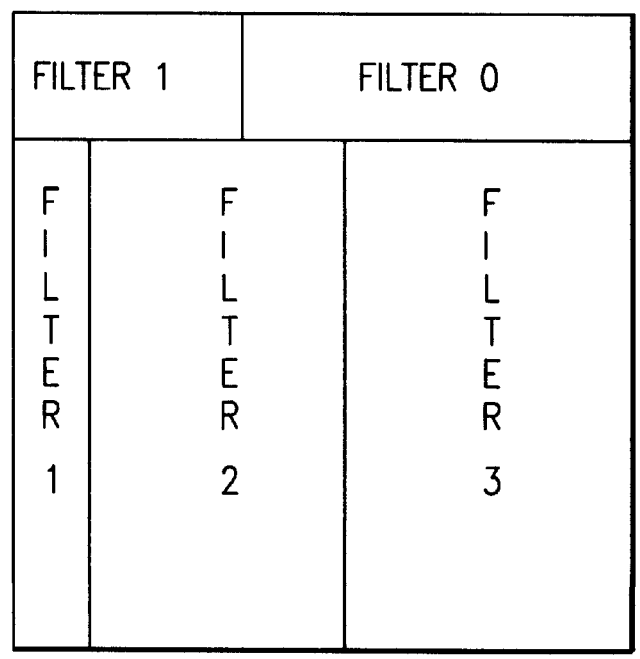

FIG. 3a illustrates how a chip may be divided into different regions including different features. The type of each feature is labeled in each region in FIG. 3a. FIG. 3b illustrates a corresponding filter that may be utilized to create the pattern illustrated in FIG. 3a. As can be seen in FIG. 3b, four filtering levels are utilized. As illustrated by FIG. 3b, all the filter levels need not be different. For example, the filter level to create the EEPROM region illustrated in FIG. 3a can be the same as the filter level utilized in creating the DRAM feature illustrated in FIG. 3a.

Figure 4:
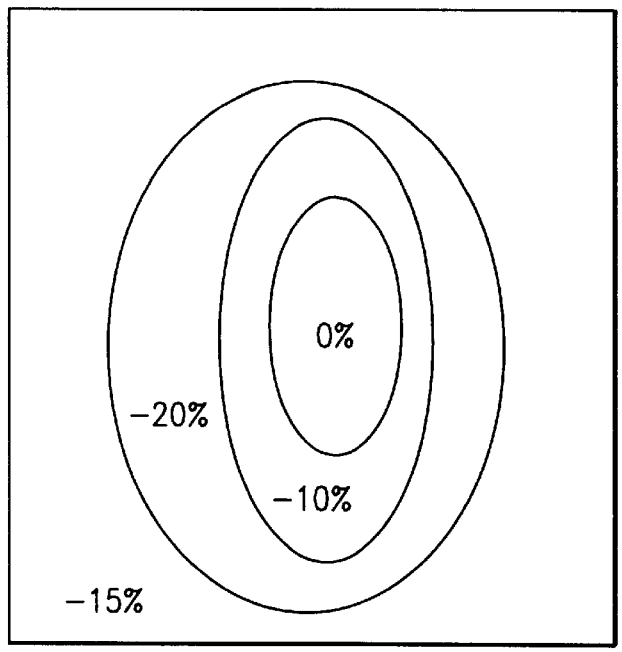
FIG. 4 represents an diagram that illustrates various dosage levels that may be provided on a photosensitive material.

FIG. 4 illustrates different levels of filtering within a reticle field.

The present invention also includes a method of making a filter mask. The method includes providing a glass mask blank. The mask blank is coated with chrome. The chrome is coated with photoresist. The resist is exposed with a desired pattern. Typically, according to the present invention, the mask resist is exposed with a pattern of small isolated features, such as the chrome dots discussed above. The features may have a localized density to block a desired amount of light as the mask is utilized in photolithography processes. The photoresist is then developed and the chrome etched using the remaining photoresist as a mask.

The chrome dots, thin film, or ion implant may be utilized on separate masks or a photolithography mask. If they are utilized on a photolithography mask, they may be arranged on the front side or back side of the mask. Along these lines, FIGS. 6a, 6b, and 6c illustrate various configurations of filters according to the present invention.

Figure 6A:
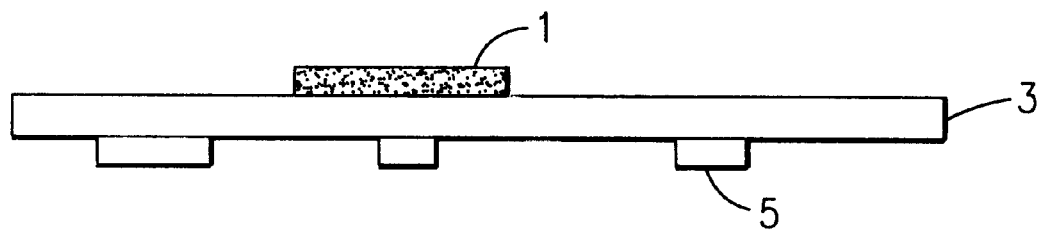
FIGS. 6a, 6b, and 6c represent cross-sectional views of a three embodiments of filter configurations according to the present invention.

As shown in FIG. 6a, a filter 1 may be included on the backside of an existing photolithography mask 3. In other words, the filter 1 is include on the opposite side of the mask from the typical mask features 5. The filter 1 may include any one or more of the chrome dots, thin film, or ion implant discussed above or any other structure for accomplishing the same function as the chrome dots, thin film, or ion implant.

Figure 6B:
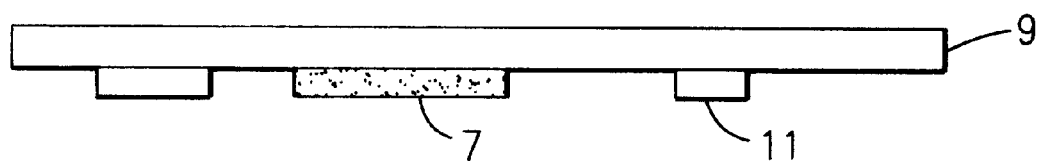
Figure 6C:
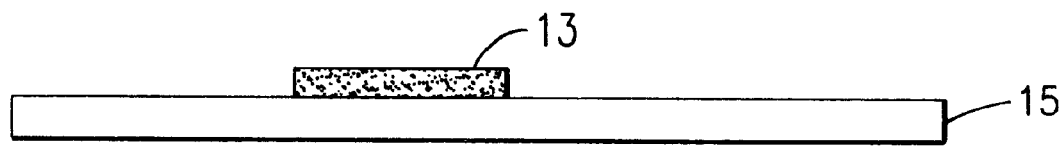

FIG. 6b illustrates a filter configuration where the filter element(s) 7 are arranged on the mask 9 on the same side as the mask features 11. As illustrated in FIG. 6c, the filter element(s) 13 may also be included on a separate mask 15. The embodiments illustrated in FIGS. 6a and 6c may provide better results as compared to the embodiment represented in FIG. 6b.

Figure 5:
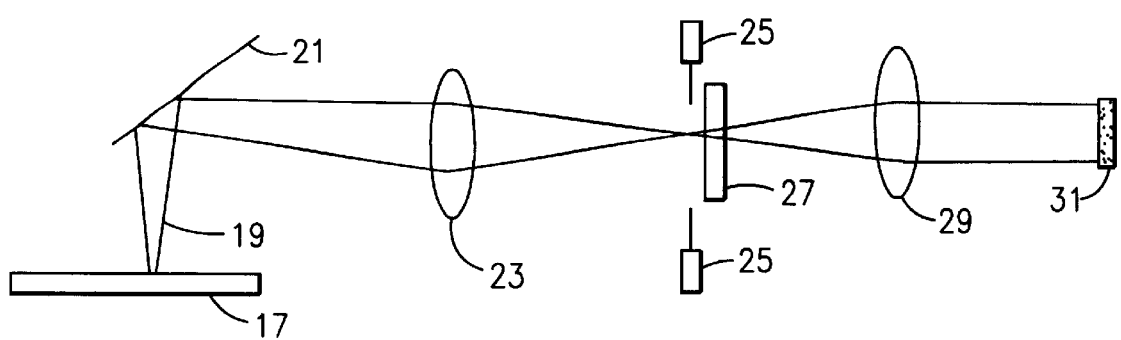
FIG. 5 represents a schematic side view of an embodiment of an optical system according to the present invention.

FIG. 5 illustrates an example of an optical system that has been modified according to the present invention. The embodiment illustrated in FIG. 5 includes a typical feature mask 17. Light 19 passing through the mask 17 is reflected off surface 21 through lens 23. The system illustrated in FIG. 5 includes in-focus blinds 25 commonly utilized in photolithography systems. A filter mask 27 according to the present invention may be arranged in the path of light 19. After passing through filter 27, the light may then pass through another lens 29 that may be included in the system. The light may then illuminate substrate 31.

The foregoing description of the invention illustrates and describes the present invention. Additionally, the disclosure shows and describes only the preferred embodiments of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

We claim:

1. A method of variably exposing photosensitive material, comprising:
   providing a semiconductor wafer;
   identifying a first target region and a second target region on the semiconductor wafer;
   providing the photosensitive material on the semiconductor wafer;
   providing an illuminating system comprising a source of illumination;
   providing a mask between the source of illumination and the photosensitive material; and
   illuminating the photosensitive material through the mask with the illuminating system to provide in a single step of the illuminating system a first illumination dose to the first target region and a second illumination dose to the second target region, the first illumination dose differing from the second illumination dose, wherein no further illumination dose is provided to equalize the first illumination dose and the second illumination dose.

2. The method according to claim 1, wherein the illuminating system is a scanning illumination system.

3. The method according to claim 2, wherein illuminating the photosensitive material comprises, varying at least one parameter of the illuminating system during the single step to provide the first illumination dose in the first target region and the second illumination dose in the second target region.

4. The method according to claim 3, wherein the parameter includes intensity of the source of illumination.

5. The method according to claim 4, wherein the source of illumination has a brightness and the intensity is varied by varying the brightness.

6. The method according to claim 4, wherein the source of illumination provides pulses of illumination having a pulse frequency, a and wherein the intensity is varied by varying the frequency.

7. The method according to claim 4, wherein the intensity is varied by varying pulse width.

8. The method According to claim 4, by varying focus of the source of illumination.

9. The method according to claim 1, wherein the first illumination dose and the second illumination dose are provided by filtering the source of illumination.

10. The method according to claim 9, wherein the filtering comprises arranging between the source of illumination and the photosensitive material at least one filter including differential levels of filtering.

11. The method according to claim 10, wherein each level of filtering uniformly filters the source of illumination.

12. The method according to claim 10, wherein each level of filtering gradationally filters the source of illumination.

13. The method according to claim 9, wherein the filtering comprises arranging between the source of illumination and the photosensitive material a plurality of filters including differential levels of filtering.

14. The method according to claim 9, wherein the filtering comprises adding at least one non-transparent feature to the mask.

15. The method according to claim 14, wherein the at least one non-transparent feature is randomly arranged.

16. The method according to claim 9, wherein the filtering comprises adding at least one chrome dot on the mask.

17. The method according to claim 9, wherein the filtering comprises a thin film layer or implanted ions.

18. The method according to claim 1, wherein the first illumination dose and the second illumination dose are provided by introducing localized dose offsets that change resulting line widths in the photosensitive material.

19. The method according to claim 1, wherein a plurality of illumination target regions are identified and a plurality of illumination doses are provided to the target regions.

20. The method according to claim 3, wherein illuminating the photosensitive material is carried out with a scanner and the parameter includes at least one member selected from the group consisting of relative angle of the scanner and the semiconductor wafer, distance between the scanner and the semiconductor wafer, scanning speed, roll, pitch, yaw, and relative movement of the scanner and semiconductor wafer in x, y, and z direction.

21. The method according to claim 3, wherein illuminating the photosensitive material is carried out with a scanner and the parameter includes relative speed of the mask and the semiconductor wafer during scanning.

22. The method according to claim 3, wherein the at least one parameter is varied in steps.

23. The method according to claim 3, wherein the at least one parameter is varied continuously.

24. A method of variably exposing photosensitive material, the method comprising:

identifying at least two target regions on the photosensitive material; and illuminating the photosensitive material in one step with at least two illumination doses to the at least two target regions, wherein at least some of the illumination doses differ from each other, wherein no further illumination is provided to equalize the illumination doses.

\* \* \* \* \*